United States Patent
Wu et al.

(10) Patent No.: US 6,727,029 B1
(45) Date of Patent: Apr. 27, 2004

(54) METHOD FOR MAKING RETICLES WITH REDUCED PARTICLE CONTAMINATION AND RETICLES FORMED

(75) Inventors: Cheng-Ming Wu, Tainan (TW); Paul Chu, Tainan (TW); Chiou-Sung Chiu, Jubei (TW); Chih-Wing Chang, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/336,550

(22) Filed: Jan. 2, 2003

(51) Int. Cl.[7] .................................................. G03F 9/00
(52) U.S. Cl. ................................ 430/5; 428/14; 355/75
(58) Field of Search ................................ 430/5; 428/14; 378/34, 35; 355/75

(56) References Cited

U.S. PATENT DOCUMENTS 6,594,073 B2 * 7/2003 Wang .......................... 359/350
6,627,365 B1 * 9/2003 Shiraishi ....................... 430/30

* cited by examiner

Primary Examiner—Mark F. Huff
Assistant Examiner—Saleha Mohamedulla
(74) Attorney, Agent, or Firm—Tung & Associates

(57) ABSTRACT

A reticle for holding a mask thereon with reduced particle contamination problem is described. The reticle is constructed by a base plate that is formed of an optically transparent material such as quartz and has a recessed slot in a top surface to enclose an area at least the size of a mask formed on the base plate. An adhesive partially fills the recessed slot such that a top surface of the adhesive is at least 0.5 mm below the top surface of the base plate. A pellicle frame is mounted in the recessed slot with a bottom end of the frame encased in the adhesive and a thin film covering the top end of the pellicle frame to from a hermetically sealed cavity for protecting the mask.

18 Claims, 1 Drawing Sheet

METHOD FOR MAKING RETICLES WITH REDUCED PARTICLE CONTAMINATION AND RETICLES FORMED

FIELD OF THE INVENTION

The present invention generally relates to a method for making reticles for use in a photolithographic process and reticles formed and more particularly, relates to a method for making reticles that have reduced particle contamination problem by providing a recessed slot in a top surface of a quartz plate for holding an adhesive and reticles formed by such method.

BACKGROUND OF THE INVENTION

A reticle, by definition, is a transparent ceramic substrate that is coated with a metallic layer to form a pattern for an electronic circuit. The reticle is generally used in an imaging step during a photolithographic process where a pattern of a circuit is reproduced on the surface of an electronic substrate, i.e. on a wafer surface. In a general sense, a reticle, or a photomask, is a template for wafer lithography, much like a photographic negative. The fabrication process for a photomask is similar to that of wafers, i.e., a layer of a suitable metal such as chrome is deposited on a plate of pure quartz, called a photoblank. A layer of a photoresist and anti-reflective coating are also deposited. The combined layer is then exposed by a photomask production tool, commonly known as an e-beam or a laser-based pattern generation tool. These tools directly write onto the photomask the original stored IC design that was inputted by the circuit designer. The photoresist layer is then developed and the chrome layer is etched in the specific pattern. Where the chrome has been etched, pure quartz is left through which visible or UV light can penetrate. The remaining photoresist layer is then stripped, while the mask is inspected for integrity and ready for use.

The fabrication process for the reticle, or photomask, starts with the selection of a photoblank. Quartz is the most commonly used photoblank material due to its excellent optical and process characteristics. The mask size can range from a 3" square with a thickness of the mask ranging between 6 mm to 25 mm. As the area of the glass is increased, the thickness of the glass must also be increased to support the weight of the glass.

A pellicle, or an ultra-thin transparent film, is placed on top of a pellicle frame over the photomask to seal or protect the photomask from contamination and damage. The pellicle protects the photomask in such a way that particles fallen onto and adhering to the pellicle surface are kept at a distance far enough away from the wafer surface such that they are not imaged onto the wafer surface during the pattern exposure process. The pellicle membrane film is coated with an anti-reflective coating to improve the optical performance at deep UV wavelengths. The pellicle membrane film can be formed of a polymeric material such as Mylar® which must be stable enough to retain its shape both over a long period of time and prolonged exposure to UV light.

A conventional reticle with a pellicle protection film covered on top is shown in FIG. 1. The reticle 10 is constructed by a base plate 12 formed of quartz, a metallic layer 14 formed of chrome on top of the quartz plate 12. A pellicle frame 16 is positioned on top of the base plate 12 and adhered to a top surface 18 by an adhesive bead layer 20. A pellicle membrane film 22 is placed on top of the pellicle frame 16 to seal and shield the photomask, i.e. the patterned chrome layer 14, from contamination and damage.

In connection with the scanner tool is an integrated reticle inspection system (IRIS) which is used to in-line scan both surfaces of the quartz side and the pellicle side prior to the processing of a wafer lot. When the IRIS inspection system detects particles on the surface of the pellicle or the quartz plate, a dry nitrogen gas is blown onto the pellicle and the quartz plate to remove the particles. However, during the nitrogen blowing process, not only particles are blown away, some contaminating particles generated by an aged polymeric adhesive bead 20 may also be blown into the cavity 24 under the pellicle which become a contamination source for the mask layer 14. The contamination problem is especially severe when the polymeric based adhesive 20 is aged after prolonged usage and numerous UV exposure processes.

It is therefore an object of the present invention to provide a reticle for holding a mask thereon without the drawbacks or shortcomings of the conventional reticles.

It is another object of the present invention to provide a reticle for holding a mask thereon that has a reduced particle contamination problem.

It is a further object of the present invention to provide a reticle for holding a mask thereon wherein the mask is protected by a pellicle without a particle contamination problem.

It is another further object of the present invention to provide a reticle for holding a mask thereon without a particle contamination problem generated by an adhesive bead that bonds a pellicle frame to the reticle.

It is still another object of the present invention to provide a reticle that has a recessed slot formed in a top surface of the quartz plate for holding an adhesive therein and for bonding to a pellicle frame.

SUMMARY OF THE INVENTION

In accordance with the present invention, a method for making a reticle that has reduced particle contamination problem and a reticle thus made are disclosed.

In a preferred embodiment, a reticle for holding a mask thereon with reduced particle contamination problem can be provided which includes a base plate formed of an optically transparent material capable of surviving a service temperature of at least 50° C., the base plate has a recessed slot in a top surface enclosing an area that is at least an area of a mask formed on the base plate; an adhesive partially filling the recessed slot in the top surface of the base plate such that a top surface of the adhesive is at least 0.5 mm below the top surface of the base plate; a pellicle frame mounted in the recessed slot with a bottom end of the pellicle frame encapsulated in the adhesive and a top end extended vertically away from the top surface of the base plate; and a film covering the top end of the pellicle frame forming a hermetically sealed chamber cavity between the pellicle frame, the top surface of the base plate and the transparent film for keeping the mask formed on the top surface of the base plate in a substantially particle-free environment.

In the reticle for storing a mask with reduced particle contamination, the base plate may be formed of quartz. The base plate may have a thickness of at least 6 mm, while the recessed slot may have a depth of at least 2 mm. The mask may be formed of a metal that includes chromium, the adhesive may be formed of a polymer-based adhesive. The pellicle frame may be formed of a metal such as stainless steel. The film that covers the top end of the pellicle frame may be a polymeric film. The top surface of the adhesive may be at least 1 mm below the top surface of the base plate.

The present invention is further directed to a method for making reticles with reduced particle contamination which can be carried out by the operating steps of first providing a base plate that is formed of an optically transparent material that has a mask formed on a top surface; forming a recessed slot in the top surface of the base plate enclosing an area that is at least an area occupied by the mask; positioning a bottom edge of a pellicle frame in the recessed slot; filling the recessed slot with an adhesive encasing the bottom edge of the pellicle frame such that a top surface of the adhesive is at least 0.5 mm below the top surface of the base plate; and sealing a top edge of the pellicle frame with an optically transparent film forming a hermetically sealed chamber cavity between the pellicle frame, the top surface of the base plate and the optically transparent film such that the mask is kept in a substantially particle-free environment.

The method for making reticles with reduced particle contamination problem may further include the step of forming the base plate in quartz, the step of forming the mask on the top surface of the base plate in a metal that includes chromium, and the step of forming the recessed slot to a depth of at least 2 mm. The method for may further include the step of forming the base plate to a thickness of at least 6 mm, and preferably to a thickness of at least 10 mm. The method may further include the step of filling the recessed slot with a polymeric-based adhesive, or with an adhesive until a top surface of the adhesive is at least 1 mm below the top surface of the base plate. The method may further include the step of forming the pellicle frame in a rigid, non-particle-generating material, or the step of forming the pellicle frame in a stainless steel. The method may further include the step of forming the optically transparent film in a polymeric material.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for making reticles with reduced particle contamination problem and reticles formed by the method.

In a preferred embodiment, a reticle for holding a mask thereon that has reduced particle contamination problem can be provided which includes the major components of a base plate, an adhesive filling a recessed slot in the base plate, a pellicle frame, and a film covering the pellicle frame.

The base plate can be advantageously formed of an optically transparent ceramic material such as a quartz that is capable of surviving a service environment of at least 50° C. on long-term basis. The base plate is provided with a recessed slot in a top surface to enclose an area that is at least the area of a mask that is formed on the base plate. The recessed slot is partially filled with a polymeric-based adhesive such that a top surface of the adhesive is at least 0.5 mm below the top surface of the base plate. A pellicle frame is provided which is fabricated of a non-particle-producing material such as stainless steel. A bottom edge of the pellicle frame is mounted in the recessed slot and encased in the adhesive while a top edge of the pellicle frame extends vertically upwardly away from the top surface of the base plate. A pellicle, or a thin film covers the top edge of the pellicle frame to form a hermetically sealed chamber cavity between the pellicle frame, the top surface of the base plate and the transparent film to keep the mask in a substantially particle-free environment.

Figure 1:
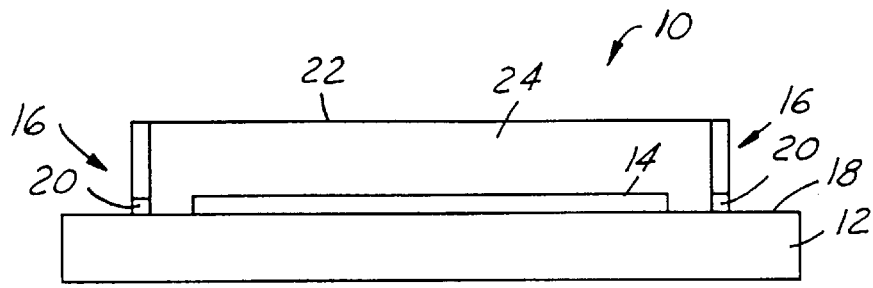
FIG. 1 is a cross-sectional view of a conventional reticle formed with a pellicle frame adhesively bonded to a top surface of the quartz plate.
Figure 2:
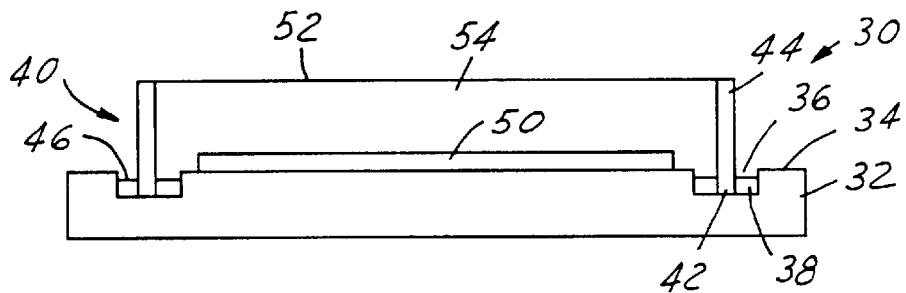
FIG. 2 is a cross-sectional view of the present invention reticle with the pellicle frame adhesively bonded in a recessed slot in the top surface of the quartz plate.

Referring now to FIG. 2, wherein a cross-sectional view of a present invention reticle 30 is shown. The reticle 30 is constructed by an optically transparent ceramic substrate 32. One of such suitable, optically transparent ceramic substrates is a quartz plate. The quartz plate has a top surface 34 having formed therein a recessed slot 36. The recessed slot 36 is partially filled with an adhesive material 38 for encasing a bottom edge 42 of a pellicle frame 40. The quartz plate 32 may have a suitable thickness in the range of about 10 mm, while a suitable depth of the recessed slot 36 is about 2 mm. A suitable range for the recessed slot 36 may be between about 2 mm and about 4 mm. The word "about" used in this writing indicates a range of values that are ±10% of the average value given. The width of the recessed slot 36 should be sufficient for holding the pellicle frame 40 in the slot with adhesive 38 encasing the bottom edge 42. A suitable width of the recessed slot 36 is thus between about 4 mm and about 10 mm.

On the top surface 34 of the quartz plate 32, is formed a mask pattern 50 by a suitable metallic material, such as chromium. The mask 50 is protected from the environment by a pellicle 52 which is a thin film of polymeric nature stretched over the top edge 44 of the pellicle frame 40. The pellicle 52, the pellicle frame 44, together with the top surface 34 of the quartz plate 32, forms a hermetically sealed cavity 54 therein. The cavity 54 seals and protects the mask 50 from any particle contamination that may be caused by aged, or deteriorated adhesive 38 in the recessed slot 36 during a nitrogen blowing process for removing particles outside the cavity 54.

Figure 3:
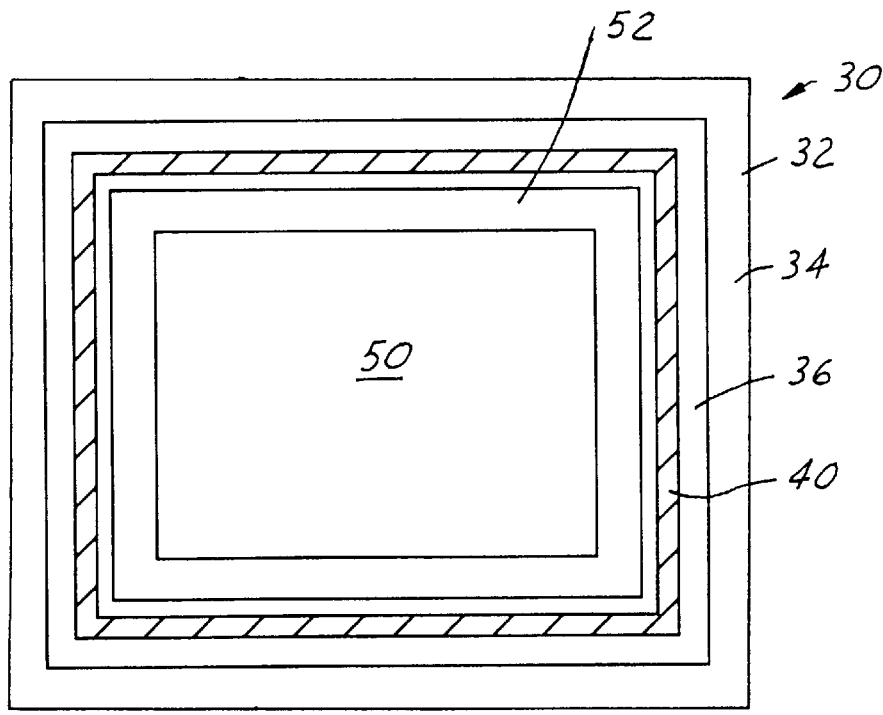
FIG. 3 is a plane view of the present invention reticle shown in FIG. 2.

A plane view of the present invention reticle 30 is shown in FIG. 3. It should be noted that the graph is shown for illustration purposes only and therefore, may not be drawn to scale.

The present invention further discloses a method for making reticles with reduced particle contamination problem. The method can be carried out by first providing a base plate 32 formed of an optically transparent material such as quartz that has a mask 50 formed on a top surface 34. A recessed slot 36 is then formed in the top surface 34 of the base plate 32 to enclose an area that is at least an area occupied by the mask 50. A bottom edge 42 of a pellicle frame 40 is then positioned in the recessed slot 36. The recessed slot 36 is then filled with an adhesive 38 encasing the bottom edge 42 of the pellicle frame 40 such that a top surface 46 of the adhesive 38 is at least 0.5 mm below the top surface 34 of the base plate 32. Preferably, the top surface 46 should be at least 1 mm below the top surface 34 of the base plate 32. A top edge 44 of the pellicle frame 40 is then sealed by an optically transparent film 52 to form a hermetically sealed chamber cavity 54 between the pellicle frame 40, the top surface 34 of the base plate 32 and the optically transparent film 52 such that the mask 50 is kept in a substantially particle-free environment in cavity 54.

The present invention novel method for making a reticle that has reduced particle contamination problem and the reticle formed by the method have therefore been amply described in the above description and in the appended drawings of FIGS. 2 and 3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A reticle for storing a mask with reduced particle contamination comprising:
   a base plate formed of an optically transparent material capable of surviving a service temperature of at least 50° C., said base plate having a recessed slot in a top surface enclosing an area that is at least an area of a mask formed on said base plate;
   an adhesive partially filling said recessed slot in said top surface of the base plate such that a top surface of said adhesive is at least 0.5 mm below said top surface of the base plate;
   a pellicle frame mounted in said recessed slot with a bottom end of said pellicle frame encapsulated in said adhesive and a top end extending vertically away from said top surface of the base plate; and
   a film covering said top end of the pellicle frame forming a hermetically sealed chamber cavity between said pellicle frame, said top surface of the base plate and said film for keeping said mask formed in a substantially particle-free environment on said top surface of the base plate.

2. A reticle for storing a mask with reduced particle contamination according to claim 1, wherein said base plate is formed of quartz.

3. A reticle for storing a mask with reduced particle contamination according to claim 1, wherein said base plate has a thickness of at least 6 mm, said recessed slot has a depth of at least 2 mm.

4. A reticle for storing a mask with reduced particle contamination according to claim 1, wherein said mask is formed of a metal that comprises Cr.

5. A reticle for storing a mask with reduced particle contamination according to claim 1, wherein said adhesive is a polymer-based adhesive.

6. A reticle for storing a mask with reduced particle contamination according to claim 1, wherein said pellicle frame is formed of metal.

7. A reticle for storing a mask with reduced particle contamination according to claim 1, wherein said film that covers the top end of the pellicle frame is a polymeric film.

8. A reticle for storing a mask with reduced particle contamination according to claim 1, wherein said top surface of the adhesive is at least 1 mm below said top surface of the base plate.

9. A method for making reticles with reduced particle contamination comprising the steps of:
   providing a base plate formed of an optically transparent material having a mask formed on a top surface;
   forming a recessed slot in said top surface of said base plate enclosing an area that is at least an area occupied by said mask;
   positioning a bottom edge of a pellicle frame in said recessed slot;
   filling said recessed slot with an adhesive encasing said bottom edge of the pellicle frame such that a top surface of the adhesive is at least 0.5 mm below said top surface of the base plate; and
   sealing a top edge of said pellicle frame with an optically transparent film forming a hermetically sealed chamber cavity between said pellicle frame, said top surface of the base plate and said optically transparent film such that said mask is kept in a substantially particle-free environment.

10. A method for making reticles with reduced particle contamination according to claim 9 further comprising the step of forming said base plate in quartz.

11. A method for making reticles with reduced particle contamination according to claim 9 further comprising the step of forming said mask on said top surface of the base plate in a metal that comprises Cr.

12. A method for making reticles with reduced particle contamination according to claim 9 further comprising the step of forming said recessed slot to a depth of at least 2 mm.

13. A method for making reticles with reduced particle contamination according to claim 9 further comprising the step of forming said base plate to a thickness of at least 6 mm.

14. A method for making reticles with reduced particle contamination according to claim 9 further comprising the step of filling said recessed slot with a polymeric-based adhesive.

15. A method for making reticles with reduced particle contamination according to claim 9 further comprising the step of filling said recessed slot with an adhesive until a top surface of the adhesive is at least 1 mm below the top surface of the base plate.

16. A method for making reticles with reduced particle contamination according to claim 9 further comprising the step of forming said pellicle frame in a rigid, non-particle-generating material.

17. A method for making reticles with reduced particle contamination according to claim 9 further comprising the step of forming said pellicle frame in a stainless steel.

18. A method for making reticles with reduced particle contamination according to claim 9 further comprising the step of forming said optically transparent film in a polymeric material.

* * * * *